(12) United States Patent
Galvagni et al.

(10) Patent No.: US 7,006,359 B2
(45) Date of Patent: Feb. 28, 2006

(54) MODULAR ELECTRONIC ASSEMBLY AND METHOD OF MAKING

(75) Inventors: John L. Galvagni, Surfside Beach, SC (US); George Korony, Myrtle Beach, SC (US)

(73) Assignee: AVX Corporation, Myrtle Beach, SC (US)

( * ) Notice: Subject to any disclaimer, the term of this patent is extended or adjusted under 35 U.S.C. 154(b) by 0 days.

(21) Appl. No.: 10/891,413

(22) Filed: Jul. 14, 2004

(65) Prior Publication Data

US 2005/0030725 A1    Feb. 10, 2005

Related U.S. Application Data

(60) Provisional application No. 60/486,969, filed on Jul. 14, 2003.

(51) Int. Cl.
 *H05K 7/02* (2006.01)
 *H05K 3/30* (2006.01)

(52) U.S. Cl. .............. 361/761; 361/762; 361/763; 361/782; 29/841; 29/852

(58) Field of Classification Search ........ 361/761–764, 361/782, 793; 174/260; 29/830, 832, 841, 29/846, 852
See application file for complete search history.

(56) References Cited

U.S. PATENT DOCUMENTS

| | | | |
|---|---|---|---|
| 4,800,459 A | 1/1989 | Takagi et al. | |
| 5,373,627 A | 12/1994 | Grebe | |
| 5,401,913 A | 3/1995 | Gerber et al. | |
| RE35,064 E * | 10/1995 | Hernandez | 361/763 |
| 5,497,033 A | 3/1996 | Fillion et al. | |
| 5,866,952 A | 2/1999 | Wojnarowski et al. | |
| 5,888,627 A | 3/1999 | Nakatani | |
| 5,987,732 A * | 11/1999 | Lee et al. | 29/600 |
| 6,038,133 A | 3/2000 | Nakatani et al. | |
| 6,218,729 B1 | 4/2001 | Zavrel, Jr. et al. | |
| 6,407,929 B1 * | 6/2002 | Hale et al. | 361/763 |
| 6,586,827 B1 * | 7/2003 | Takeuchi et al. | 257/687 |
| 6,753,612 B1 * | 6/2004 | Adae-Amoakoh et al. | 257/774 |
| 6,844,505 B1 * | 1/2005 | Fan et al. | 174/260 |
| 2003/0221864 A1 * | 12/2003 | Bergstedt et al. | 174/260 |
| 2004/0165361 A1 * | 8/2004 | Kimura et al. | 361/763 |
| 2004/0170006 A9 * | 9/2004 | Sylvester et al. | 361/794 |

* cited by examiner

*Primary Examiner*—John B. Vigushin
(74) *Attorney, Agent, or Firm*—Dority & Manning, P.A.

(57) ABSTRACT

A modular electronic assembly and a method for making a modular electronic assembly are disclosed. The subject modular electronic assembly is constructed in such a way as to maximize available surface area on printed wiring boards by incorporating pretested discrete passive elements within the body of such printed wiring boards and electrically connecting the elements in a volume-efficient manner. A modular electronic assembly constructed according to the presently disclosed subject matter is formed by arranging a plurality of diverse, pretested passive components between a plurality of copper and tacky epoxy sheets, holding the passive components in place by an epoxy resin layer and electrically connecting the components together by electrical vias penetrating the tacky epoxy layers. A modular electronic assembly according to the disclosed technology provides maximum available "real estate" for mounting active and other components on the surface of printed wiring boards while significantly reducing the amount of lead (Pb) used to form similar known printed wiring boards.

51 Claims, 6 Drawing Sheets

MODULAR ELECTRONIC ASSEMBLY AND METHOD OF MAKING

PRIORITY CLAIM

This application claims the benefit of previously filed U.S. Provisional Patent Application entitled "MODULAR ELECTRONIC ASSEMBLY AND METHOD OF MAKING," assigned U.S. Ser. No. 60/486,969, filed Jul. 14, 2003, and which is incorporated herein by reference for all purposes.

BACKGROUND OF THE INVENTION

The present subject matter generally concerns a modular electronic assembly for use in a range of applications. Exemplary modules may correspond to functional modules for cell phones such as voltage-controlled oscillators (VCOs) and modules for use with Bluetooth brand technology, such as those developed and/or offered for sale by Bluetooth SIG, Inc. Corporation. More particularly the subject matter concerns modular electronic assemblies constructed using methods that produce a higher volumetric efficiency than previously possible. The present subject matter utilizes specialized assembly techniques to create a printed wiring board (PWB) that maximizes the available surface "real estate" for mounting other components while, at the same time, provides discrete components encased within internal areas of the PWB. An especially significant feature of the presently disclosed subject matter is the creation of a modular electronic assembly using techniques that produce modules with solder features containing significantly less lead (Pb).

The continually growing complexity of modern technical applications creates a constant need for improvement in the efficient use of available "real estate" on printed wiring boards. As electronic devices become smaller and, at the same time, more complex, there is an ongoing need to find ways to accommodate such conflicting desires. Recent efforts have been directed to the concept of moving passive elements off of valuable surface areas and into the printed wiring board itself. These efforts have resulted in multilayered circuit boards where passive elements are built onto one or more internal layers of the PWB. This concept has been referred to as "embedded" or "integrated" passives.

Examples of known multi-layered printed circuit boards include U.S. Pat. No. 4,800,459 (Takagi et al); U.S. Pat. No. 5,866,952 (Wojnarowski et al); U.S. Pat. No. 6,038,133 (Nakatani et al); and U.S. Pat. No. 6,218,729 B1 (Zavrel, Jr. et al).

Problems have been discovered with such known multilayer circuit board construction techniques based on a variety of causes. In prior printed circuit boards, passive elements have been either embedded or integrated into the core layers of the printed circuit boards. Embedded components, as disclosed in the Takagi et al (U.S. Pat. No. 4,800,459) patent noted above, require that cavities be provided within the various ceramic layers to accommodate chip-like electronic components. These cavities must be mechanically machined into the various layers and require precision placement of component holes especially when a component is larger than the thickness of one of the layers. This is a time-consuming process and can result in cracks that could render the substrate unusable.

Wojnarowski et al (U.S. Pat. No. 5,866,952) addresses further aspects of such cracking problems by teaching a circuit module construction technique wherein a material is molded around various electrical components. Electrical wiring connections are then provided to produce a circuit module. This technique addresses the cracking problem, but results in an unduly thick form factor for the module.

Another approach taken to address the surface "real estate" problem has been to integrate passive components directly into packaging substrates. Zavrel, Jr. et al (U.S. Pat. No. 6,218,729 B1) discloses one such technique wherein a multilayer substrate is composed of electrically conductive layers of interconnects separated by insulative layers of epoxy resin or ceramic and connected by vias. According to Zavrel's concept, passive components are integrated within the substrate at the definition stage during layout of the interconnections, but these components may be made from inferior quality materials. Often, it has been found that, upon completion of the printed circuit boards made with these techniques, final testing has shown that some components are defective. Such discoveries, after testing, can result in the entire circuit board being scrapped because of one faulty component.

Another problem with known printed circuit boards, and of presently growing concern, is the use of significant amounts of lead (Pb) in the solder used to attach passive, as well as active, elements to the printed circuit boards. It has become more desirable to minimize the use of lead.

Additional background references that concern electronic assembly modules and/or related aspects thereof include U.S. Pat. No. 5,373,627 (Grebe), U.S. Pat. No. 5,401,913 (Gerber et al), U.S. Pat. No. 5,497,033 (Fillion et al), and U.S. Pat. No. 5,888,627 (Nakatani). The disclosures of all the forgoing United States patents are hereby fully incorporated into this specification for all purposes by reference thereto.

While various aspects and alternative features are known in the field of electronics assemblies and other modular devices, no one design has emerged that generally addresses all of the issues as presented herein.

BRIEF SUMMARY OF THE INVENTION

The present subject matter recognizes and addresses various of the foregoing shortcomings, and others concerning certain aspects of electronic assembly technology. Thus, broadly speaking, principal objects of the presently disclosed technology are to provide an improved modular electronic assembly and techniques for constructing such an assembly. More particularly, the presently disclosed modular electronic assembly offers preferred savings in surface "real estate" and, at the same time, higher production yield.

It is a principal object of the presently disclosed technology to provide a modular electronic assembly that maximizes available printed wiring board surface areas by relocating passive components to the internal parts of the printed wiring board.

Another principal object of the present subject matter is to provide multiple diverse components and corresponding advantages thereof in a modular electronic assembly. Varied combinations of the multiple components offer flexibility in the electronic module design. The presently disclosed modular electronic assembly may provide a selected plurality of passive components (e.g., resistors, capacitors, conductor plugs, inductors, varistors, etc.) arranged and interconnected in any desired fashion.

An additional principal object of the present subject matter is to provide improved production yield by constructing modular electronic assemblies using discrete, pretested passive components.

Yet another principal object of the present subject matter is to provide a modular electronic assembly constructed in a manner that significantly reduces the amount of lead (Pb) used in printed wiring boards.

Additional objects and advantages of the present subject matter are set forth in, or will be apparent to those of ordinary skill in the art from, the detailed description herein. Also, it should be further appreciated by those of ordinary skill in the art that modifications and variations to the specifically illustrated, referenced, and discussed features and steps hereof may be practiced in various embodiments and uses of this invention without departing from the spirit and scope thereof, by virtue of present reference thereto. Such variations may include, but are not limited to, substitution of equivalent means and features, materials, or steps for those shown, referenced, or discussed, and the functional, operational, or positional reversal of various parts, features, steps, or the like.

In one exemplary embodiment of the present subject matter, a modular electronic assembly includes a plurality of pretested passive components, first and second conductive layers (e.g., copper layers), a fill material, and a plurality of plated through-vias. The plurality of pretested passive components (e.g., one or more of resistors, capacitors, inductors, varistors, diodes, conductive plugs, etc.) are characterized by first and second opposing surfaces, selected of which are adhered to the first conductive layer. The respective passive component surfaces opposite those mounted to the first conductive layer are adhered to the second conductive layer. The first and second opposing surfaces adhered to the conductive layers may be components ends or component sides depending on the dimensions of the pretested passive components, which may vary. The fill material, for example an epoxy resin, substantially fills the area around the pretested passive components between the first and second conductive layers. The plurality of plated through-vias are formed through selected portions of the first and second conductive layers to contact area(s) provided on selected surfaces of selected pretested passive components.

In other embodiments, conductor patterns may be etched into the first and/or second conductive layers to couple multiple passive components together. Solder masks may also be screen-printed on top of the first and/or second conductive layers and formed with openings that lead to selected of the plated through-vias or to the etched conductor patterns if those are formed. Tacky epoxy layers may be utilized to help adhere the passive components to the respective first and second conductive layers and also to provide electrical insulation. Additional conductive layers and intermediate epoxy layers may also be provided adjacent to the first and/or second conductive layers. These optional additional conductive and intermediate layers may also be provided with plated through-holes, etched conductor patterns and/or solder masks to form defined openings therethrough.

In another embodiment, a modular electronic assembly includes first and second sheets, each sheet having a conductive layer (e.g., copper) and an adhesive layer (e.g., tacky epoxy), a plurality of electronic components, a fill material, and a plurality of plated through-vias. The plurality of electronic components may include pretested passive components such as previously mentioned and are characterized by first and second opposing surfaces. These first and second opposing surfaces may be the ends of some components and the sides of others, especially when electronic component dimensions are varied. This design versatility allows for placement of the components such that the dimension between first and second opposing sides is substantially similar among components. The first and second opposing surfaces of each electronic component are provided adjacent to the respective adhesive layers and surrounded by the fill material such that a multilayer arrangement delimited by the two conductive layers is effected.

In more particular embodiments, the through-vias are formed by laser ablation and filled with a conductive plating material. Conductor patterns may be etched into the first and/or second conductive layers to couple multiple electronic components together. Solder masks may also be screen-printed on top of the first and/or second conductive layers and formed with openings that lead to selected of the plated through-vias or to the etched conductor patterns if those are formed. Additional sheets of conductive and adhesive layers may also be provided adjacent to the first and/or second sheet, and may also be configured with plated through-holes, etched conductor patterns and/or solder masks to form defined openings therethrough.

The present subject matter equally concerns various exemplary methodologies for practice and manufacture of all the herein referenced modular assemblies.

For example, a method of making a modular electronic assembly may selectively include the following steps. Initial steps may correspond to providing a first conductive layer and affixing selected surfaces of a plurality of passive components thereto. The passive components may be pretested before being affixed to the first conductive layer in order to help ensure effective component operation. The area above the first conductive layer and surrounding the passive components is then filled with a fill material, for example an epoxy resin, such that the passive component surfaces opposing those adhered to the first conductive layer remain exposed. A second conductive layer may then be adhered to the exposed portions of the passive components. Adherence of the first and second conductive layers to the respective passive component surfaces may be facilitated by providing respective tacky epoxy layers. Through-vias may then be cut through portions of the first and second conductive layers and/or corresponding tacky epoxy layers such that contact areas of selected passive components are exposed. In some embodiments, the through-vias are formed by laser ablation. A conductive material may then be plated into and substantially filling the through-vias. A variety of methods, including electroless plating, electrostatic plating and plating with magnetic particle attraction may be employed to deposit the conductive material in the through-vias. Conductor patterns may be etched into selected of the first and second conductive layers such that selected portions of the conductive material filling the through-vias are coupled together. A solder mask may also be screen-printed onto selected of the conductive layers to define a plurality of openings for exposing selected portions of the etched conductor patterns. In still further embodiments, the modular electronic assembly is then also mounted to a mounting surface such that the openings formed by the solder mask correspond to respective contact locations on the mounting surface. Active components may also be mounted to selected sides of the modular electronic assembly.

In accordance with these exemplary embodiments of the disclosed technology and others, it is to be understood that different arrangements of the presently disclosed subject matter may include various combinations or configurations of presently disclosed features, steps or elements, or their equivalents, including combinations of features or steps or configurations thereof not expressly shown in the figures or stated in the detailed description.

Those of ordinary skill in the art will better appreciate the features and aspects of the presently disclosed subject matter upon review of the remainder of the specification.

BRIEF DESCRIPTION OF THE DRAWINGS

A full and enabling description of the presently disclosed subject matter, including the best mode thereof, directed to one of ordinary skill in the art, is set forth in the specification, which makes reference to the appended figures, in which.

DETAILED DESCRIPTION

Figure 1:
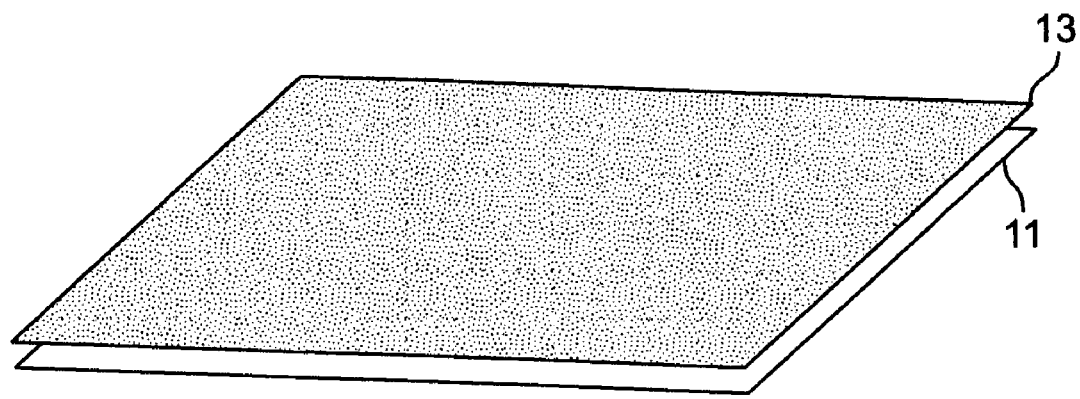
FIG. 1 illustrates an exemplary copper and tacky epoxy sheet for use with modular electronic assembly embodiments in accordance with the present subject matter.

As referenced in the Brief Summary of the Invention section, supra, the present subject matter is directed towards an improved modular electronic assembly and related preparation techniques. More particularly, the construction of the disclosed modular electronic assembly is begun as illustrated in FIG. 1 by providing a copper and tacky epoxy sheet 10 consisting of a tacky epoxy layer 13 provided adjacent to a copper foil layer 11. In preparation of the modular electronic assembly, the copper and tacky epoxy sheet 10 is provided as shown in FIG. 1 with the tacky epoxy side up. Reference to this and other particular orientations is used merely for the sake of convenience and should in no way convey limitations of the present technology.

Figure 2:
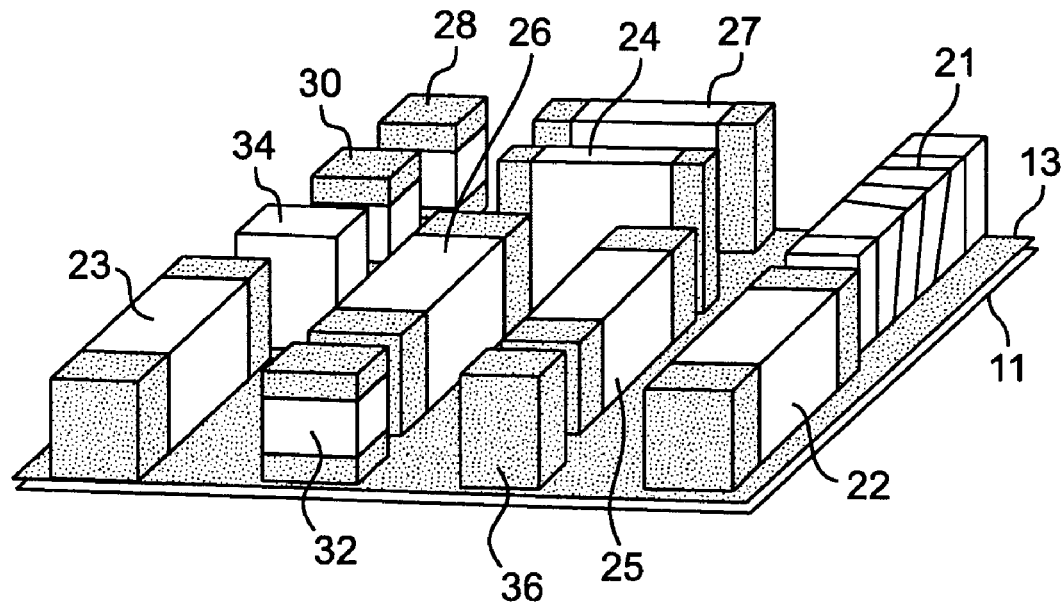
FIG. 2 illustrates an exemplary plurality of discrete passive components positioned relative to an exemplary copper and tacky epoxy sheet in accordance with modular electronic assembly embodiments in accordance with the present subject matter.

With reference now to FIG. 2, the modular electronic assembly of the presently disclosed subject matter is constructed by placing a number of pretested passive components in selected positions on the tacky epoxy layer 13. The pretested passive components are temporarily held in position by the tacky epoxy. For the purposes of this disclosure, passive components are considered to consist of any passive component and may include components such as resistors, capacitors, inductors, varistors, diodes, conductive plugs, and other similar electrical components. Exemplary passive component sizes for use in accordance with the disclosed technology may correspond to 0201 and 0402 standard case sizings as recognized by the Electronic Industries Alliance (EIA). These designations refer to the length and width of the components and correspond to measurements of 0.020 inches by 0.010 inches (0201) and 0.040 inches by 0.020 inches (0402), respectively. It should be appreciated that other component sizes may also be utilized in accordance with the present subject matter while still remaining within the spirit and scope of the present subject matter.

Still referring to FIG. 2, as can be seen, a number of electrical components have been placed on the tacky epoxy layer 13 in preselected orientations. In the illustrated representative embodiment, inductor 21, resistor 22, capacitors 23, 24, 25, varistor 26, and diode 27 are "0402" sized devices and have been placed on the tacky epoxy layer 13 in such a fashion as to present their respective "02" sides as the vertical dimension relative to the tacky epoxy layer 13. In this orientation, these components may be considered to have been placed on their "sides." As previously stated, such particular reference to orientation is used merely for the sake of convenience and should in no way convey limitations of the present technology. Similar consideration should be given to other such references hereinafter. In the illustrated representative embodiment of FIG. 2, resistor 28, capacitors 30, 32, and conductive plugs 34, 36 are "0201" sized devices and have been placed on the tacky epoxy 13 in such a fashion as to present their "02" sides as the vertical dimension relative to the tacky epoxy layer 13. In this orientation, these components may be considered to have been placed on their "ends." The exemplary embodiment of FIG. 2 as described and illustrated orients the various passive components in a manner such that all components extend generally the same distance away (about 0.020 inches) from tacky epoxy layer 13. Such a configuration becomes advantageous for later construction steps, but it should be appreciated that different component orientations may also be utilized with the disclosed technology.

Figure 3:
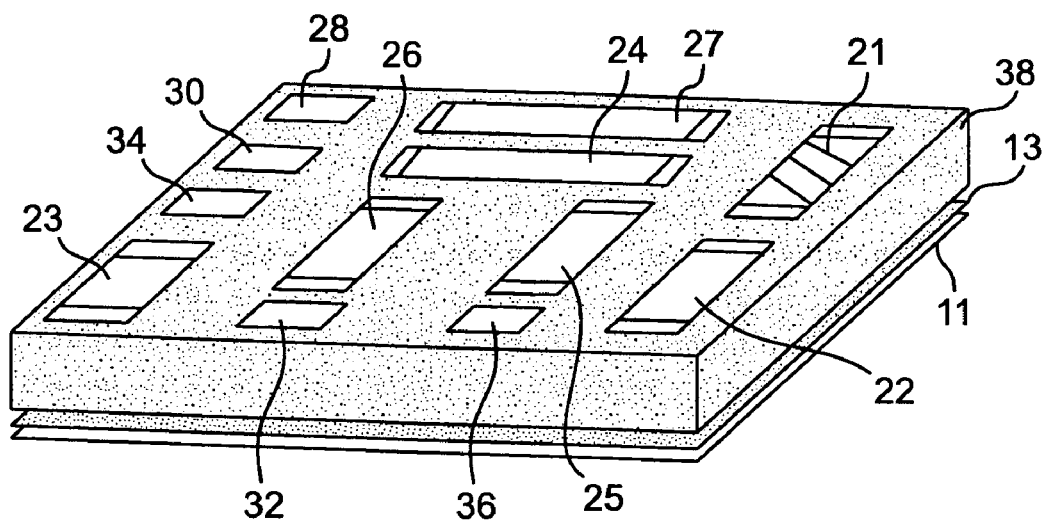
FIG. 3 depicts aspects of epoxy fill surrounding the exemplary discrete components of FIG. 2 in accordance with modular electronic assembly embodiments of the present subject matter.

Following placement of the passive components in their preselected positions on the tacky epoxy 13, the space between the components is preferably filled with an epoxy resin 38, as shown in FIG. 3. The epoxy resin 38 is filled in to a level so as to leave exposed the top surfaces of the various passive components.

Figure 4:
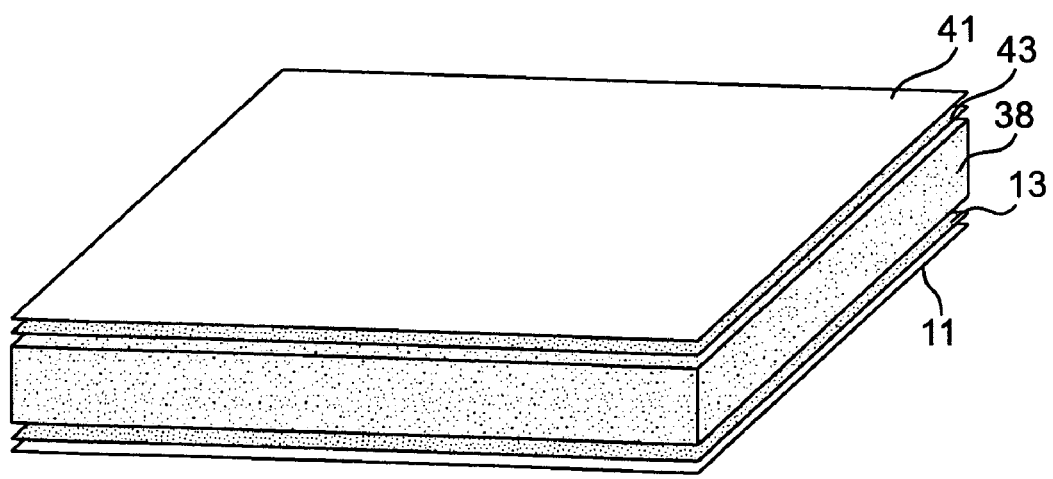
FIG. 4 illustrates the exemplary modular electronic assembly embodiment of FIG. 3 with an additionally applied exemplary copper and tacky epoxy sheet in accordance with the present subject matter.

Next, as shown in FIG. 4, a second copper and tacky epoxy sheet 40 comprising copper layer 41 and tacky epoxy layer 43 is applied this time with the copper side 41 up. The resulting layers as combined as shown in FIG. 4 are now configured so as to resemble an unetched double-sided copper-clad circuit board. Assembly of the two copper and tacky epoxy sheets in this manner provides a compact arrangement that positively secures the various passive components in place for further processing of the modular electronic assembly.

Figure 5:
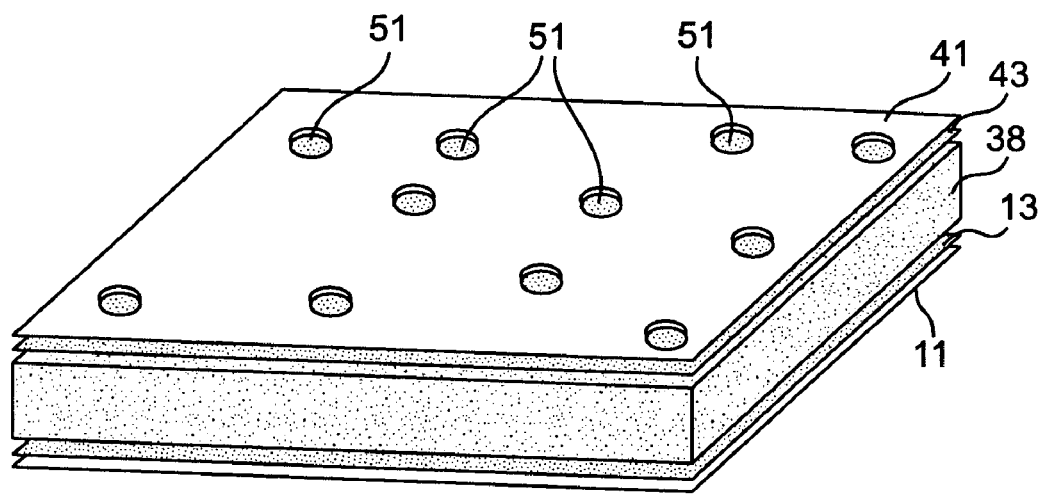
FIG. 5 illustrates partial aspects of an exemplary modular electronic assembly embodiment with vias formed through selected locations thereof in accordance with the present subject matter.
Figure 6:
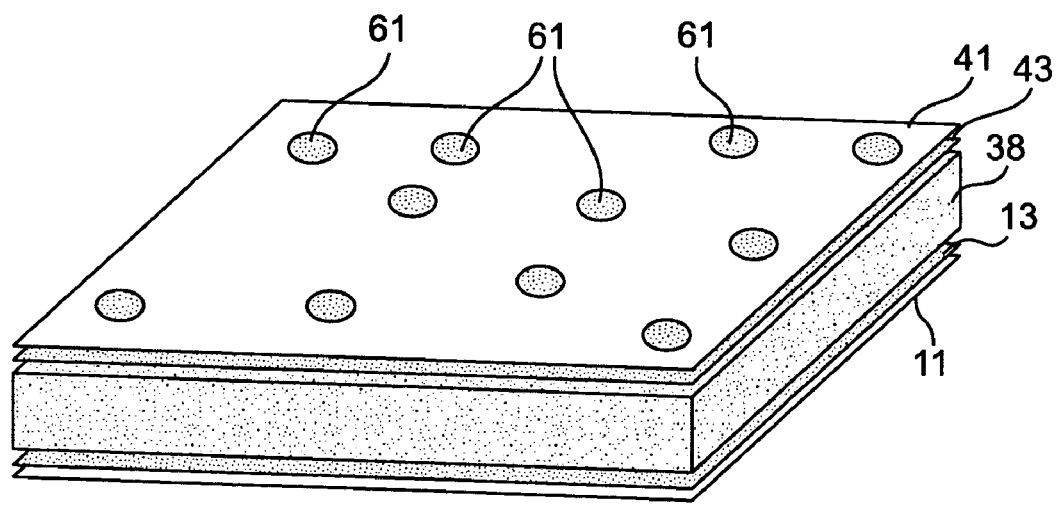
FIG. 6 depicts aspects related to plating the vias formed as depicted in FIG. 5 in accordance with exemplary modular electronic assembly embodiments of the present subject matter.

Processing of the modular electronic assembly continues as illustrated in FIG. 5. As shown, vias 51 are preferably formed at predetermined locations. These vias may be formed by any suitable means, but in the preferred embodiment the vias are cut by laser ablation. Vias 51 pass through the copper layer 41 and tacky epoxy layer 43 and extend to the conductive contact areas of selected of the various passive components 21–36 respectively. Following formation of the vias 51, the vias are plated with copper to form electrical contacts 61 as shown in FIG. 6. By subjecting vias 51 to an electroless plating solution, for example nickel or copper ionic solution, the formation of plated terminations 61, such as is shown in FIG. 6, is preferably effected. Exposure to such solution enables the vias 51 to become deposited with nickel, copper, tin or other metallic plating.

Another technique that may be utilized in accordance with the formation of the subject plated terminations involves magnetic attraction of plating material. For instance, nickel particles suspended in a bath solution can be attracted to similarly conductive components by taking advantage of the magnetic properties of nickel. Other materials with similar magnetic properties may be employed in the formation of plated terminations.

A still further technique regarding the application of plated termination material to exposed conductive components involves the principles of electrophoretics or electrostatics. In accordance with such exemplary technology, a bath solution contains electrostatically charged particles. A modular electronic assembly or other multilayer component with exposed conductive portions may then be biased with an opposite charge and subjected to the bath solution such that the charged particles are deposited at select locations on the component. This technique is particularly useful in the application of glass and other semiconductive or nonconductive materials. Once such materials are deposited, it is possible to thereafter convert the deposited materials to conductive materials by intermediate application of excessive heat to the component.

Figure 7:
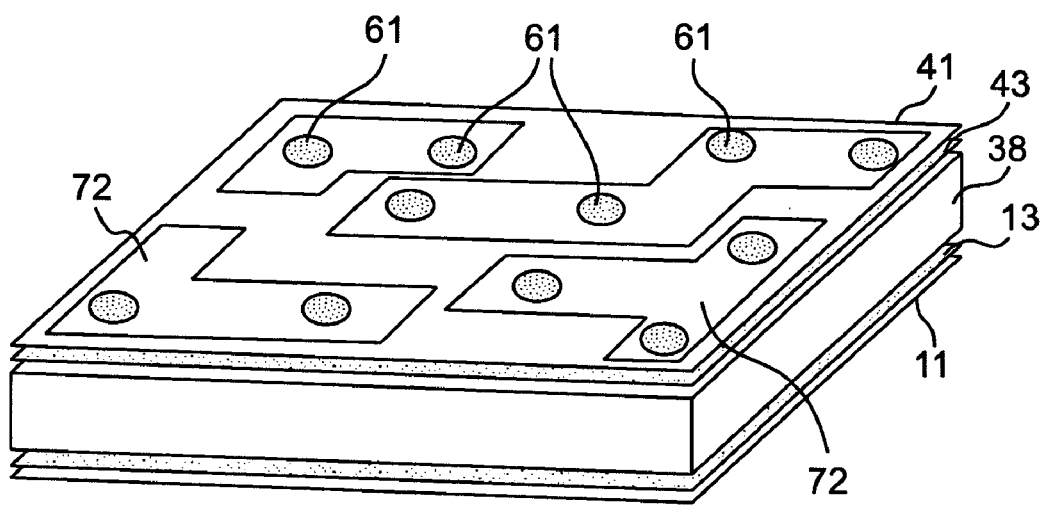
FIG. 7 depicts aspects related to etching conductor patterns in accordance with exemplary modular electronic assembly embodiments of the present subject matter.

Processing of the modular electronic assembly continues as shown in FIG. 7 with a step of the etching conductor patterns 72 in the second copper and tacky epoxy sheet 40. The conductor patterns 72 connect selected of the various passive components in any desired fashion to complete the wiring of an exemplary embodiment of the presently disclosed subject matter.

Figure 8:
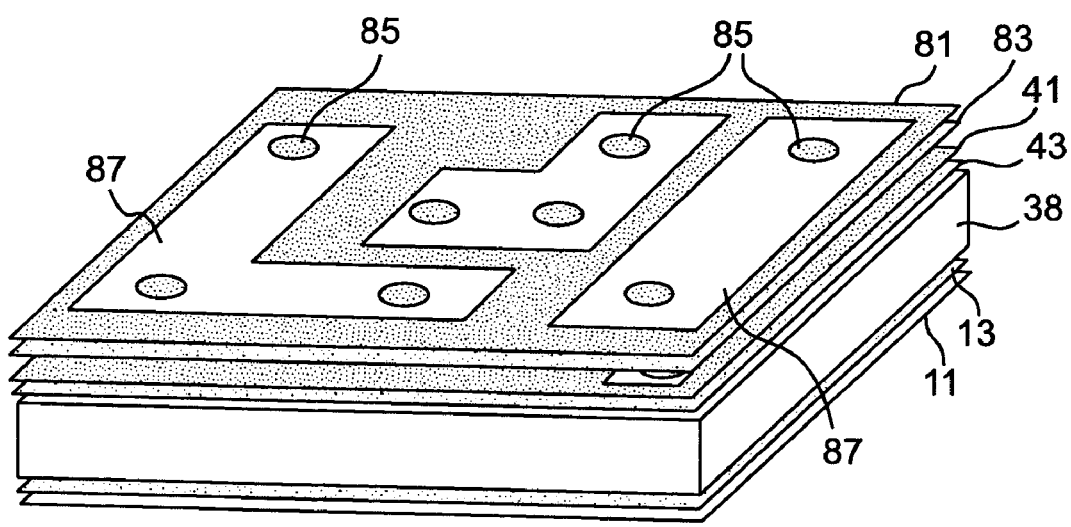
FIG. 8 illustrates exemplary aspects of subsequent modular electronic assembly processing such as previously described with respect to FIGS. 5–7, respectively.

If desired, an additional copper and tacky epoxy sheet comprising copper layer 81 and tacky epoxy layer 83 may be added followed by further processing similar to that illustrated in FIGS. 5 through 7. Such further processing would result in additional conductor patterns 87 with cut and plated vias and electrical contacts 85 as shown in FIG. 8.

Figure 9:
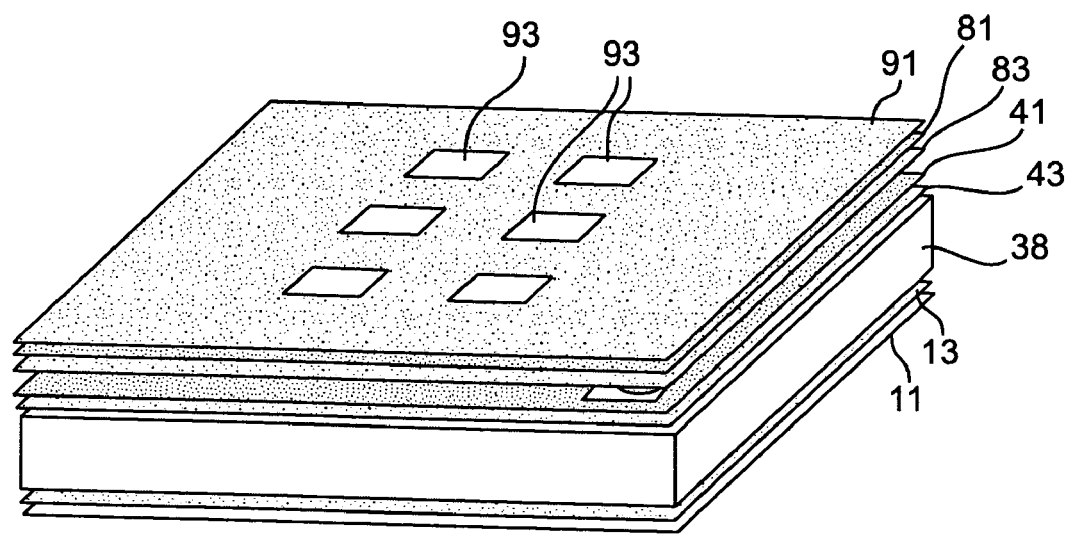
FIG. 9 depicts aspects related to screen printing a solder mask in accordance with exemplary modular electronic assembly embodiments of the present subject matter.

Finally, to complete an exemplary embodiment of the presently disclosed subject matter, a solder mask 91, as shown in FIG. 9, may be screen printed on the etched copper layer 41, or the etched copper layer 81 if the additional copper and tacky epoxy layer 80 is used, leaving exposed contact areas 93. These contact areas may be used to attach active components, or any other appropriate electronic components, to the surface of the modular electronic assembly.

Figure 10:
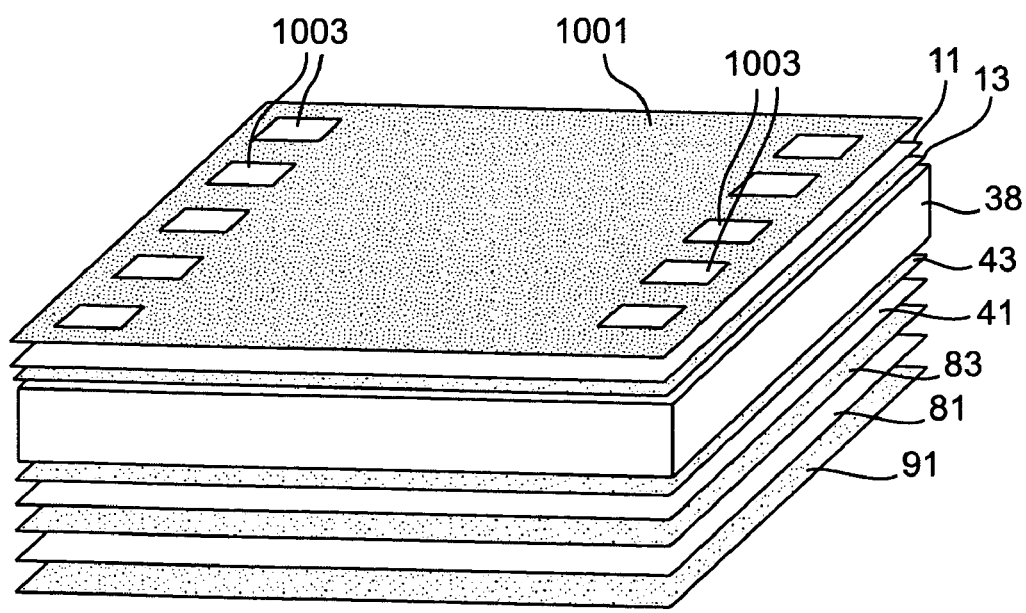
FIG. 10 illustrates an inverted view of the exemplary modular electronic assembly depicted in FIG. 9, with exemplary aspects of contact schemes in accordance with the present subject matter.

By flipping the modular electronic assembly over, the initial copper layer 11 can be adapted to provide any predetermined contact arrangement for attachment to a circuit board. Cutting and plating vias as previously described can achieve selective attachment to the internal passive components. Additionally, by connecting to the conductive plugs 34, 36 (FIG. 2), contact can be made with the top set of electrical conductors, thus enabling the conductive plugs to act as a via from top to bottom of the modular electronic assembly. As with the other surface of the modular electronic assembly, a solder mask 1001 may be applied to leave exposed contact areas 1003 as illustrated in FIG. 10.

Figure 11:
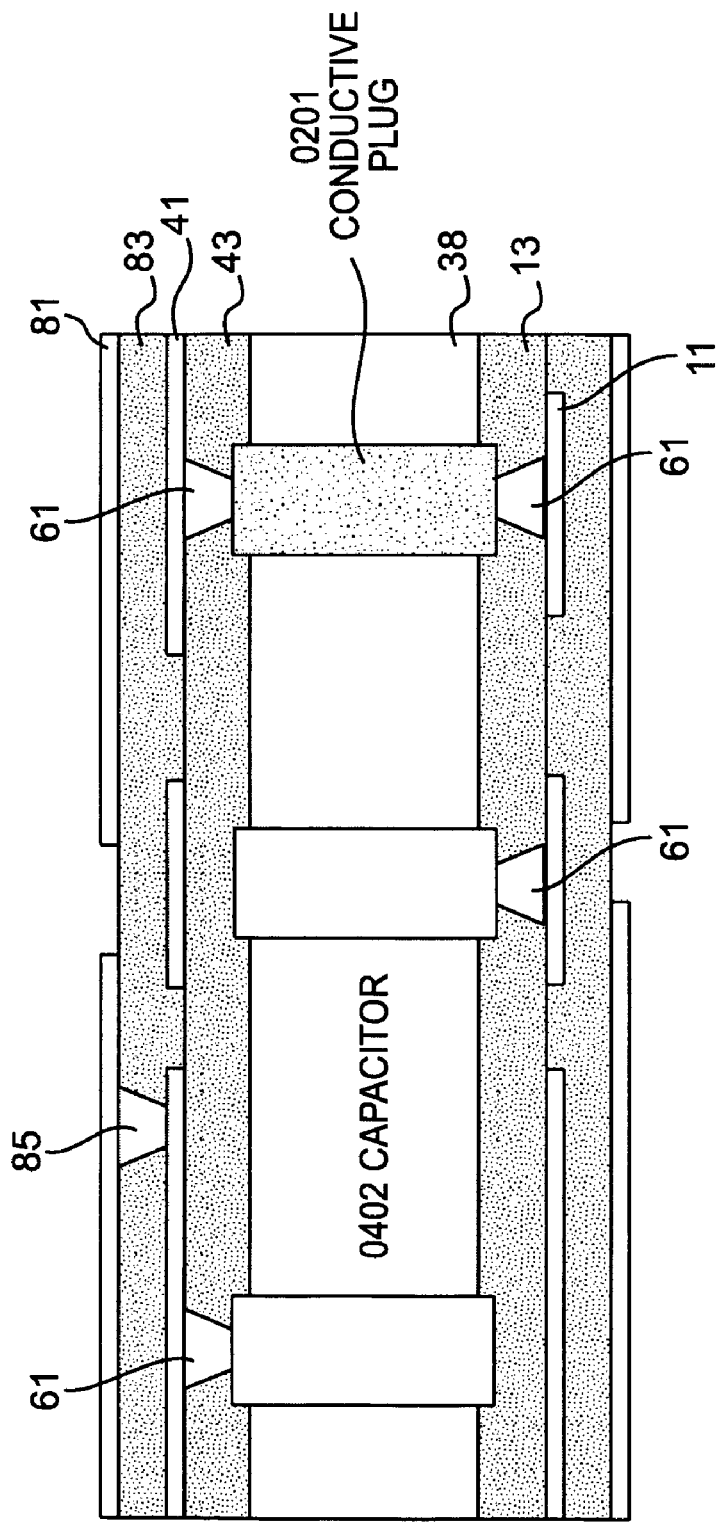
FIG. 11 displays a cross sectional view of an exemplary completed modular electronic assembly constructed according to the present technology.
Figure 1:
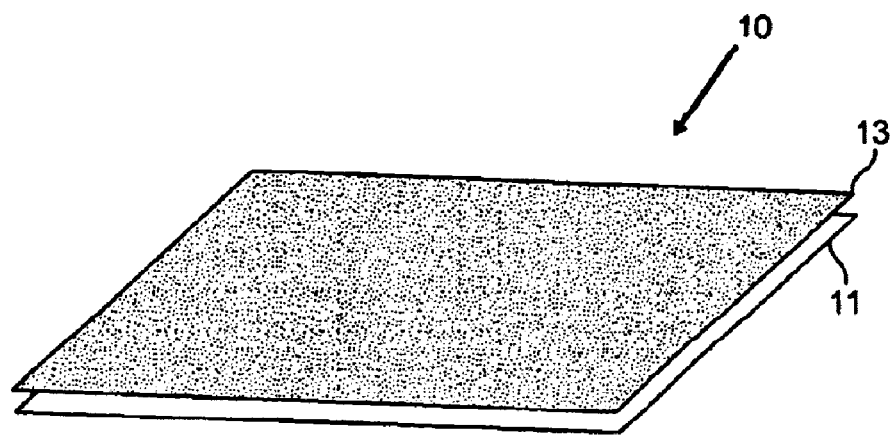
Figure 2:
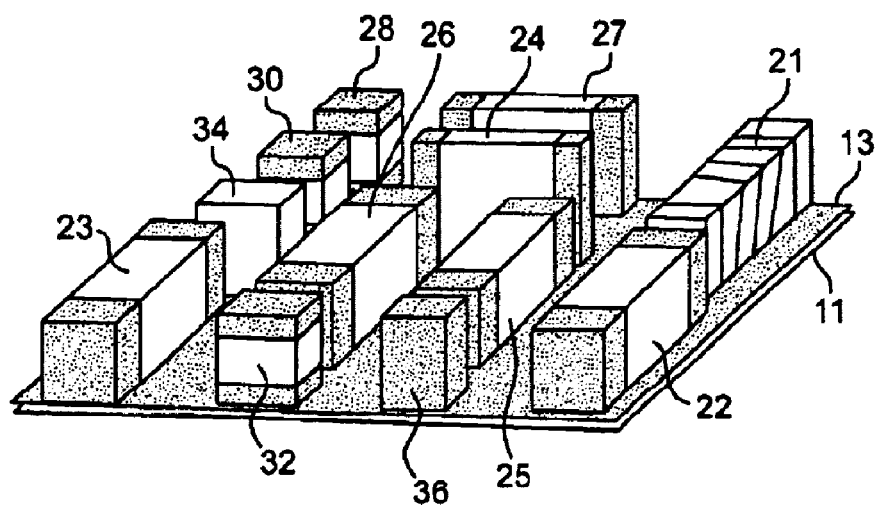
Figure 3:
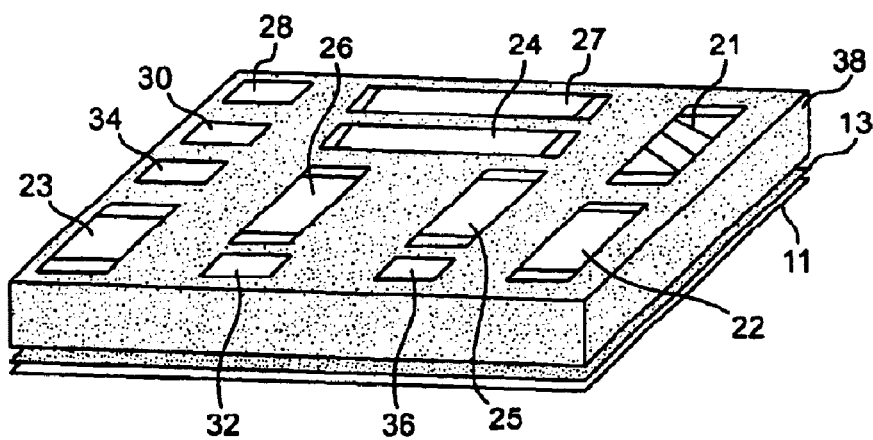
Figure 4:
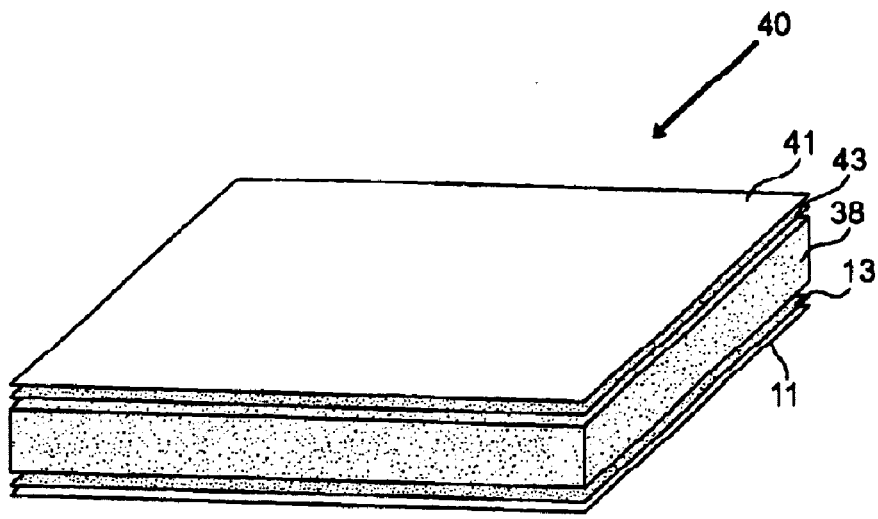

FIG. 11 illustrates a cross section of an exemplary embodiment of the modular electronic assembly of the presently disclosed subject matter and includes multiple copper and tacky layer sheets on both sides of the passive component layer. As can be seen, a "0402" capacitor is illustrated lying on its "side" and is connected between portions of electrically conductive layers 11 and 41 by plated vias 61. The illustrated "0201" conductive plug standing on its "end" connects portions of electrically conductive layers 11 and 41 by additional plated vias 61. In addition an exemplary connection is shown connecting a portion of electrically conductive layers 41 and 81 by way of plated via 85.

It should be noted that each of the exemplary embodiments should not insinuate limitations of the present subject matter. Features illustrated or described as part of one embodiment may be used in combination with aspects of another embodiment to yield yet further embodiments. Additionally, certain features may be interchanged with similar devices or features not expressly mentioned which perform the same or similar function.

It should be appreciated that the figures are not drawn to scale. Also, it should be appreciated that selected elements of each figure may not be represented in proportion to other elements in that figure. In addition, materials that are listed as exemplary substances for forming certain elements of the embodiments as discussed herein are merely presented as examples, and should in no way limit the specific composition of the modular electronic assembly embodiments. It should be appreciated that as newly improved materials are designed and/or created, incorporation of such substances with the technology disclosed herein will be anticipated.

While the present subject matter has been described in detail with respect to specific embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure and claims herein below do not preclude inclusion of such modifications, variations and/or additions to the present subject matter as would be readily apparent to one of ordinary skill in the art.

What is claimed is:

1. A modular electronic assembly, comprising:
    a plurality of pretested passive components, each pretested passive component being characterized by respective first and second opposing surfaces, each surface having at least one contact area for electrical connection thereto;
    a first conductive layer adhered to selected first or second opposing surfaces of said plurality of pretested passive components;
    a second conductive layer adhered to the first or second surfaces of said plurality of pretested passive components opposing said selected first or second surfaces to which said first conductive layer is adhered;
    a fill material substantially filling the area around said plurality of pretested passive components between said first and second conductive layers;
    a plurality of plated through-vias selectively formed through selected of said first and second respective conductive layers for providing electrical connection to selected contact areas of the plurality of pretested passive components; and at least one solder mask screen printed over selected of the first and second respective conductive layers, said at least one solder mask formed to define a plurality of openings therethrough for exposing selected portions of said selected of the first and second respective conductive layers.

2. The modular electronic assembly of claim 1, further comprising a plurality of conductor patterns etched onto selected of said first and second respective conductive layers to electrically couple together selected of said plurality of pretested passive components.

3. The modular electronic assembly of claim 1, wherein the plurality of openings formed in said at least one solder mask are formed to correspond to respective contact locations on a mounting surface to which the modular electronic assembly is to be mounted.

4. The modular electronic assembly of claim 1, further comprising first and second epoxy layers for adhering said first and second respective conductive layers to the selected opposing first and second surfaces of said plurality of pretested passive components.

5. The modular electronic assembly of claim 1, further comprising:
  at least one additional conductive layer;
  at least one intermediate layer provided adjacent to selected of said first and second respective conductive layers such that said at least one intermediate layer separates said at least one additional conductive layer from said selected of said first and second respective conductive layers; and
  an additional plurality of plated through-vias formed through said at least one additional conductive layer and said at least one intermediate layer for providing an electrical connection to selected portions of said selected of said first and second respective conductive layers.

6. The modular electronic assembly of claim 1, wherein said plurality of pretested passive components comprise one or more of resistors, capacitors, inductors, varistors, diodes and conductive plugs.

7. The modular electronic assembly of claim 1, wherein said plurality of plated through-vias respectively comprise an opening formed by laser ablation and substantially filled with a conductive material.

8. The modular electronic assembly of claim 1, wherein said first and second conductive layers comprise copper.

9. The modular electronic assembly of claim 1, wherein said fill material comprises an epoxy resin.

10. A modular electronic assembly, comprising:
  a plurality of pretested passive components, each pretested passive component being characterized by respective first and second opposing surfaces, each surface having at least one contact area for electrical connection thereto;
  a first conductive layer adhered to selected first or second opposing surfaces of said plurality of pretested passive components;
  a second conductive layer adhered to the first or second surfaces of said plurality of pretested passive components opposing said selected first or second surfaces to which said first conductive layer is adhered;
  a fill material substantially filling the area around said plurality of pretested passive components between said first and second conductive layers; and
  a plurality of elated through-vias selectively formed through selected of said first and second respective conductive layers for providing electrical connection to selected contact areas of the plurality of pretested passive components; and
  wherein said plurality of pretested passive components are of various sizes, and wherein the first and second opposing surfaces of selected components correspond to the component ends while the first and second opposing surfaces of other selected components correspond to the component sides.

11. The modular electronic assembly of claim 10, wherein the respective distances between first and second opposing surfaces of each of the plurality of pretested passive components is substantially the same.

12. A modular electronic assembly, comprising:
  a first sheet comprising a first conductive layer and a first adhesive layer;
  a plurality of electronic components, each electronic component being characterized by respective first and second opposing surfaces, each surface having at least one contact area for electrical connection thereto, wherein selected of the first and second opposing surfaces of the electronic components are affixed to the first adhesive layer of said first sheet;
  a second sheet comprising a second conductive layer and a second adhesive layer, wherein the surfaces of said plurality of electronic components opposing said selected of the first and second opposing surfaces affixed to said first adhesive layer are affixed to said second adhesive layer;
  a fill material substantially filling the area around said plurality of electronic components between said first and second sheets;
  wherein said first sheet, said second sheet, said plurality of electronic components, and said fill material form a multilayer arrangement with said first and second conductive layers forming outer opposing surfaces thereof; and wherein
  said modular electronic assembly further includes a plurality of plated through-vias selectively formed through selected of said first and second sheets for providing electrical connection to selected contact areas of said plurality of electronic components.

13. The modular electronic assembly of claim 12, further comprising a plurality of conductor patterns etched onto selected of said first and second conductive layers of said respective first and second sheets to electrically couple together selected of said plurality of plated through-vias and a corresponding plurality of electronic components.

14. The modular electronic assembly of claim 12, further comprising at least one solder mask screen printed over selected of the first and second conductive layers of the first and second respective sheets, said at least one solder mask formed to define a plurality of openings therethrough for exposing selected of said plurality of plated through-vias.

15. The modular electronic assembly of claim 14, wherein the plurality of openings formed in said at least one solder mask are formed to correspond to respective contact locations on a mounting surface to which the modular electronic assembly is to be mounted.

16. The modular electronic assembly of claim 12, wherein the first and second adhesive layers of said first and second respective sheets comprise tacky epoxy.

17. The modular electronic assembly of claim 12, further comprising:
   at least one additional sheet comprising an additional conductive layer and an additional adhesive layer provided adjacent to selected of said first and second sheets; and
   an additional plurality of plated through-vias formed through said at least one additional sheet for providing an electrical connection to selected portions of said selected of said first and second sheets.

18. The modular electronic assembly of claim 12, wherein said plurality of electronic components comprise a plurality of pretested passive components comprising one or more of resistors, capacitors, inductors, varistors, diodes and conductive plugs.

19. The modular electronic assembly of claim 12, wherein said plurality of plated through-vias respectively comprise an opening formed by laser ablation and substantially filled with a conductive material.

20. The modular electronic assembly of claim 12, wherein said first and second conductive layers comprise copper.

21. The modular electronic assembly of claim 12, wherein said fill material comprises an epoxy resin.

22. The modular electronic assembly of claim 12, wherein said plurality of electronic components are of various sizes, and wherein the first and second opposing surfaces of selected electronic components correspond to the component ends while the first and second opposing surfaces of other selected electronic components correspond to the component sides.

23. The modular electronic assembly of claim 22, wherein the respective distances between first and second opposing surfaces of each of the plurality of electronic components is substantially the same.

24. A method of making a modular electronic assembly, said method comprising the steps of:
   providing a first conductive layer;
   affixing selected surfaces of a plurality of passive components to said first conductive layer;
   substantially filling the area above said first conductive layer and around the plurality of passive components with a fill material, whereby the fill material is provided such that the surfaces of the plurality of passive components opposing the respective surfaces affixed to said first conductive layer are left exposed;
   providing a second conductive layer adjacent to the surfaces of the plurality of passive components left exposed in said filling step; and
   forming electrical terminations selectively through selected of said first and second conductive layers to conductive contact areas on selected of the plurality of passive components.

25. The method of claim 24, wherein said step of forming electrical terminations selectively through selected of said first and second conductive layers further comprises:
   cutting through-vias through selected portions of said first and second conductive layers; and
   plating conductive material into and substantially filling the through-vias.

26. The method of claim 25, wherein said step of cutting through-vias is effected by laser ablation.

27. The method of claim 25, wherein said step of plating conductive material comprises immersing the modular electronic assembly in an electroless plating solution until a predetermined amount of conductive material is plated within said through-vias.

28. The method of claim 25, wherein said step of plating conductive material comprises immersing the modular electronic assembly in a bath solution in which magnetic particles are suspended and magnetically attracted to exposed surfaces of the passive components until a predetermined amount of conductive material is plated within said through-vias.

29. The method of claim 25, wherein said step of plating conductive material further comprises steps of:
   biasing exposed conductive portions of the modular electronic assembly with a first charge; and
   immersing the biased modular electronic assembly in a bath solution containing particles that are electrostatically charged with a charge opposite that of the first charge until a predetermined amount of material is deposited in said through-vias.

30. The method of claim 29, wherein said step of plating conductive material further comprises a step of applying heat to said modular electronic assembly such that the conductivity of the material deposited in said through-vias is increased.

31. The method of claim 24, further comprising a step of providing a first epoxy layer adjacent to said first conductive layer for facilitating said affixing-step such that said plurality of passive components are held in position until said filling step is effected.

32. The method of claim 31, further comprising a step of providing a second epoxy layer adjacent to said second conductive layer for facilitating the adhesion of said second conductive layer to the selected surfaces of the plurality of passive components.

33. The method of claim 24, further comprising a step of forming etched conductor patterns in selected of said first and second conductive layers such that selected of the plurality of electrical terminations and corresponding passive components are coupled together.

34. The method of claim 33, further comprising a step of screen printing at least one solder mask on selected of the first and second conductive layers, wherein said at least one solder mask is formed to define a plurality of openings therethrough for exposing selected of said etched conductor patterns.

35. The method of claim 34, further comprising a step of mounting the modular electronic assembly to a mounting surface such that the openings formed in said at least one solder mask correspond to respective contact locations on a mounting surface.

36. The method of claim 35, further comprising a step of mounting one or more active components to selected surfaces of the modular electronic assembly other than that attached to said mounting surface.

37. The method of claim 24, further comprising the steps of:
   providing at least one additional conductive layer;
   providing at least one intermediate layer adjacent to selected of said first and second respective conductive layers such that said at least one intermediate layer separates said at least one additional conductive layer from said selected of said first and second respective conductive layers; and
   forming additional electrical terminations through said at least one additional conductive layer and said at least one intermediate layer for providing an electrical connection to selected portions of said selected of said first and second respective conductive layers.

38. The method of claim 24, wherein said affixing step comprises affixing end surfaces of selected passive components to said first conductive layer and affixing side surfaces of other passive components to said first conductive layer.

39. The method of claim 24, further comprising a step before said affixing step of pretesting the plurality of passive components to ensure effective component operation.

40. A method of making a modular electronic assembly, said method comprising the steps of:
providing a first conductive layer;
pretesting a plurality of passive components to ensure effective component operation;
affixing selected surfaces of the plurality of passive components to said first conductive layer;
substantially filling the area above said first conductive layer and around the plurality of passive components with a fill material, whereby the fill material is provided such that the surfaces of the plurality of passive components opposing the respective surfaces affixed to said first conductive layer are left exposed;
providing a second conductive layer adjacent to the surfaces of the plurality of passive components left exposed in said filling step; and
cutting through-vias through selected portions of said first and second conductive layers such that contact areas of selected of the plurality of passive components are exposed;
plating conductive material into and substantially filling the through-vias;
forming etched conductor patterns in selected of said first and second conductive layers such that selected portions of the conductive material substantially filling said through-vias and the corresponding passive components to which the conductive material provides electrical connection are coupled together; and
screen printing at least one solder mask on selected of the first and second conductive layers, wherein said at least one solder mask is formed to define a plurality of openings therethrough for exposing selected of said etched conductor patterns.

41. The method of claim 40, wherein said step of cutting through-vias is effected by laser ablation.

42. The method of claim 40, wherein said step of plating conductive material comprises immersing the modular electronic assembly in an electroless plating solution until a predetermined amount of conductive material is plated within said through-vias.

43. The method of claim 40, wherein said step of plating conductive material comprises immersing the modular electronic assembly in a bath solution in which magnetic particles are suspended and magnetically attracted to exposed surfaces of the passive components until a predetermined amount of conductive material is plated within said through-vias.

44. The method of claim 40, wherein said step of plating conductive material further comprises steps of:
biasing exposed conductive portions of the modular electronic assembly with a first charge; and
immersing the biased modular electronic assembly in a bath solution containing particles that are electrostatically charged with a charge opposite that of the first charge until a predetermined amount of material is deposited in said through-vias.

45. The method of claim 44, wherein said step of plating conductive material further comprises a step of applying heat to said modular electronic assembly such that the conductivity of the material deposited in said through vias is increased.

46. The method of claim 40, further comprising a step of providing a first epoxy layer adjacent to said first conductive layer for facilitating said affixing step such that said plurality of passive components are held in position until said filling step is effected.

47. The method of claim 46, further comprising a step of providing a second epoxy layer adjacent to said second conductive layer for facilitating the adhesion of said second conductive layer to the selected surfaces of the plurality of passive components.

48. The method of claim 40, further comprising a step of mounting the modular electronic assembly to a mounting surface such that the openings formed in said at least one solder mask correspond to respective contact locations on a mounting surface.

49. The method of claim 48, further comprising a step of mounting one or more active components to selected surfaces of the modular electronic assembly other than that attached to said mounting surface.

50. The method of claim 40, further comprising the steps of:
providing at least one additional conductive layer;
providing at least one intermediate layer adjacent to selected of said first and second respective conductive layers such that said at least one intermediate layer separates said at least one additional conductive layer from said selected of said first and second respective conductive layers; and
repeating selected of said cutting, plating, forming and screen printing steps relative to said additional conductive layer.

51. The method of claim 40, wherein said affixing step comprises affixing end surfaces of selected passive components to said first conductive layer and affixing side surfaces of other passive components to said first conductive layer.

* * * * *

UNITED STATES PATENT AND TRADEMARK OFFICE
CERTIFICATE OF CORRECTION

PATENT NO.       : 7,006,359 B2
APPLICATION NO.  : 10/891413
DATED            : February 28, 2006
INVENTOR(S)      : Galvagni et al.

It is certified that error appears in the above-identified patent and that said Letters Patent is hereby corrected as shown below:

Please replace drawing sheets 1 and 2 with the following, indicating the addition of numerals "10" and "40" on Figures 1 and 4, respectively.

Signed and Sealed this

Eleventh Day of July, 2006

JON W. DUDAS
*Director of the United States Patent and Trademark Office*

UNITED STATES PATENT AND TRADEMARK OFFICE
CERTIFICATE OF CORRECTION

PATENT NO.         : 7,006,359 B2                                        Page 1 of 1
APPLICATION NO.    : 10/891413
DATED              : February 28, 2006
INVENTOR(S)        : Galvagni et al.

It is certified that error appears in the above-identified patent and that said Letters Patent is hereby corrected as shown below:

In Column 10, line 1, please delete "elated" and replace with --plated--; and in Column 12, line 24, please delete "affixing-step" and replace with --affixing step--.

Signed and Sealed this

Twenty-second Day of August, 2006

JON W. DUDAS
*Director of the United States Patent and Trademark Office*